United States Patent [19]
Cooper et al.

[11] Patent Number: 5,294,928
[45] Date of Patent: Mar. 15, 1994

[54] A/D CONVERTER WITH ZERO POWER MODE

[75] Inventors: Russ Cooper, Chandler; Sumit Mitra, Tempe, both of Ariz.

[73] Assignee: Microchip Technology Incorporated, Chandler, Ariz.

[21] Appl. No.: 938,908

[22] Filed: Aug. 31, 1992

[51] Int. Cl.[5] .............................................. H03K 3/01
[52] U.S. Cl. ...................................... 341/142; 307/296.3
[58] Field of Search .......................... 307/272.3, 296.3; 341/142, 155

[56] References Cited

U.S. PATENT DOCUMENTS

| | | | |
|---|---|---|---|
| 4,317,180 | 2/1982 | Lies | 307/296.3 |
| 4,801,820 | 1/1989 | Nootbaar | 307/296.3 |
| 4,906,870 | 3/1990 | Gongwer | 307/296.3 |
| 4,963,769 | 10/1990 | Hiltpold et al. | 307/465 |
| 5,023,614 | 6/1991 | Fung et al. | 341/144 |
| 5,045,717 | 9/1991 | Moen, Jr. et al. | 307/296.3 |
| 5,111,079 | 5/1992 | Steele | 307/296.3 |
| 5,138,198 | 8/1992 | Shen et al. | 307/465 |

*Primary Examiner*—Marc S. Hoff
*Attorney, Agent, or Firm*—O'Connor, Cavanagh, Anderson, Westover, Killingsworth & Beshears

[57] ABSTRACT

A semiconductor microcontroller includes the capability to perform analog to digital conversions of an analog signal representative of a variable parameter indicative of the need to exercise a control function. While the analog to digital conversions are being performed, the microcontroller processor can be placed in a sleep mode which eliminates noise arising from switching activities of the processor as a source of inaccuracy in the conversion process. At the end of the conversion, the analog to digital converter can either shut itself down or wake up the processor. Alternatively, the converter may shut itself down in response to a different user selected control signal.

14 Claims, 3 Drawing Sheets

A/D CONVERTER WITH ZERO POWER MODE

CROSS-REFERENCE TO RELATED APPLICATION

This application is related to a copending application of Ser. No. 07/938,970 (the —'907 application") some of the same inventor/applicants herein, titled "Microcontroller with Improved A/D Conversion", filed on the same date as this application, assigned to the same assignee.

BACKGROUND OF THE INVENTION

The present invention relates generally to semiconductor microprocessors, to a class of microprocessors known as microcontrollers which perform a broad spectrum of control functions, and more particularly to CMOS semiconductor microcontrollers with on-chip analog to digital conversion capability.

The evolution of microprocessors into complex instruments and machines has led to sophisticated, fast realtime control capability. Large microprocessors of 16 or 32 bit capability with associated interrupt handler chips, programmable timer chips, ROM and RAM chips, have been replaced in many control function instances by single chip microcontrollers with all peripherals embedded on the same chip with the microcontroller. Operation of the chip in an expanded mode enhances the versatility of all on-chip features. Microcontrollers are used in a wide diversity of present-day applications, with new applications found almost daily. In hand-held instruments such as tiny pocket-sized pagers, the microcontroller is responsive to received characters to interpret them, produce an audible signal to notify the user of an incoming message (or not if the user prefers an inaudible mode), and produce multiple messages among the several last of those received on a suitable display, typically an LCD. The microcontroller can also recall from its internal memory any or all of the messages received in a given period of time. Among its other instrumentation uses are those as meters and testers, capable of carrying out thousands of tests, each in a millisecond or less.

Other applications include keyboard controllers for personal computers, in which the microcontroller serves to offload many tasks formerly handled by the processor, including continuous performance of numerous diagnostic procedures and notification to the processor if a problem is detected. Among other personal computer applications, microcontrollers are used in modems for command interpretation and data transmission, in printer buffers for high speed dumping of data in preparation for driving the printer at the appropriate speed, or for color plotters, in color copiers, electronic typewriters, cable television terminal equipment, lawn sprinkling controllers, credit card phone equipment, automotive applications such as engine control modules, antilock braking systems, automobile suspension control for desired designation of ride softness or rigidity according to user preference, and a host of other applications daily by industrial and consumer customers.

A real time microcontroller provides rapid solutions to signal processing algorithms and other numerically intensive computations, controls events such as opening and closing of relays, the position and speed of a motor, and other control functions such as those mentioned above. The central processing unit (CPU) of the microcontroller operates in conjunction with certain peripherals to perform the control function, including devices such as timers, signal ports, and baud rate generators, among others.

The present invention is part of an enhancement of an 8-bit user programmable reduced instruction set computer (RISC-type) microcontroller family manufactured and marketed by Microchip Technology incorporated of Chandler, Ariz. (assignee of this application) as its PIC®16C5X family of CMOS (complementary metal-oxide-silicon) EPROM (electrically programmable read-only memory)-based microcontrollers. The enhanced user-programmable single chip device addresses the burgeoning number of embedded control applications requiring economical analog sensing and control applications. The device includes the capability to perform analog-to-digital (A/D) conversion.

Analog to digital converters (ADCs) continually consume power during operation. Known microcontrollers employing ADCs generally exhibit relatively high power consumption as a result of current drain when in use. The lowest current consumption found in such devices is specified as 100 $\mu$A.

It is a principal object of the present invention to provide apparatus and methods for efficiently deactivating or disabling all current consuming elements normally used for A/D conversions associated with performance of microcontroller functions, when such elements are not in use.

SUMMARY OF THE INVENTION

In a preferred embodiment of the present invention, a CMOS microcontroller device has an associated ADC integrated in the same silicon chip. The microcontroller processor may be deactivated upon a command by the user in the intelligent control logic of the device. The mode in which the microcontroller is rendered inactive is referred to variously as a power down mode, a sleep mode, or a halt mode. Power is not actually removed, but the system clock is disabled to stop toggling at the microcontroller input. In the device, an A/D conversion may be performed with the microcontroller processor in the "sleep" mode to eliminate sources of digital switching noise which would otherwise be present and cause error in the conversion result, as is described in detail in the aforementioned related copending '907 application.

According to the present invention, the associated on-chip ADC can completely shut off all power consuming elements in its circuit so that only diode leakage remains. Since the device is fabricated utilizing CMOS semiconductor process technology, it is inherently low power consuming, and draws current only when switching activities or the like are occurring. By shutting down all power consuming elements of the ADC, no current is drawn from the power supply during the shutdown period.

Since conversion activities are not performed continuously, but typically only at intervals when some parameter determinative of whether a control function of the microcontroller should be initiated is to be monitored, the energy saving can be quite significant. In battery operated applications—i.e., a battery is employed as the power supply for the device—only limited charge and limited current may be supplied during the battery lifetime. Hence, it is clearly desirable to conserve the battery power and, if possible, to provide or avail the circuit of a low power mode. Such a mode would not consume any current, or take any charge off the battery. By shutting down the ADC during periods of non-use, power consumption from the battery is reduced, and the battery life is increased. Of course, during the A/D conversions the ADC does require power, and thus charge is consumed from the battery.

The sleep mode of the ADC is enabled when the microcontroller is asleep or when a control bit signals the ADC to enter the mode. This may be done whenever the ADC completes its sampling function (of the analog input signal) and the conversion.

The invention is applicable to microcontrollers with A/D conversion regardless of the number of bits employed by the microcontroller or the converter in operation. Hence, references in the description of the present invention to 8-bit or other specific bit ADCs or microcontrollers are intended by way of example only, and are not intended to be a limitation on the scope or capability of the invention. The invention is also applicable to microprocessors, digital signal processors, and chips with intelligent control logic, with associated ADC.

BRIEF DESCRIPTION OF THE DRAWINGS

The above and still further objects, features, and attendant advantages of the present invention will become apparent from a consideration of the following detailed description of a presently preferred embodiment, taken in conjunction with the accompanying drawings, in which.

DESCRIPTION OF PRESENTLY PREFERRED EMBODIMENT AND METHOD

In the preferred embodiment of the invention, the user may instruct the microcontroller to sleep after sampling of the analog input signal has been performed and an A/D conversion is commenced. The ADC ignores the sleep instruction provided that the conversion is in progress when the instruction is received, and provided also that the ADC is operating from its own internal clock and not the microcontroller system clock. Upon completion of the conversion, the ADC signals the microcontroller by dispatching an interrupt to awaken the chip (the device). Alternatively, the interrupt may be ignored by the microcontroller, and after a brief delay if the ADC senses that the sleep line remains active, the ADC operates to turn itself off. It remains capable, however, of detecting removal of the sleep command by being gated by a control bit, to turn itself back on so that sampling and subsequent conversions may be performed.

Figure 1:
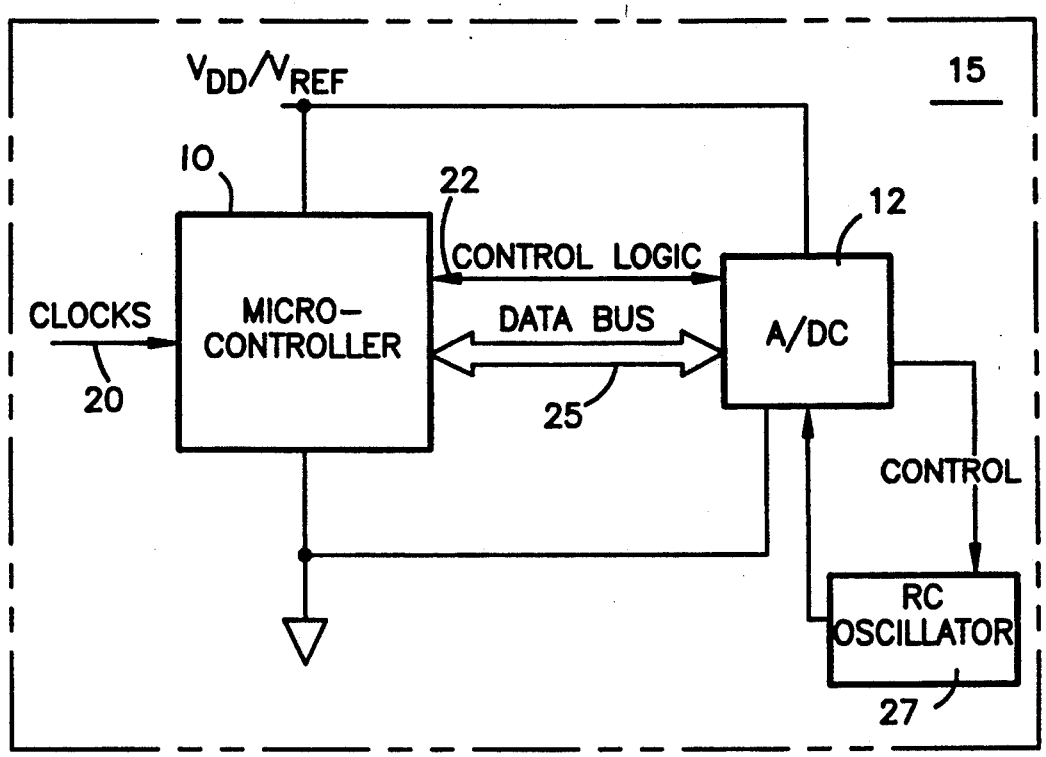
FIGS. 1 is a block diagram of a microcontroller device with ADC.

FIG. 1 is a simplified block diagram of a single CMOS semiconductor chip microcontroller device of the type utilized in conjunction with the present invention. The device includes a microcontroller 10 and an ADC 12 fabricated within silicon chip 15. The microcontroller and the ADC are powered by supply voltage $V_{DD}$ which is also $V_{REF}$, so it is shown as $V_{DD}/V_{REF}$. The microcontroller has one or more clock inputs 20, and control logic 22 and data bus 25 outputs and inputs to and from the ADC. The ADC has its own independent clock oscillator 27 which it controls (by a user option as will be explained presently).

Figure 2:
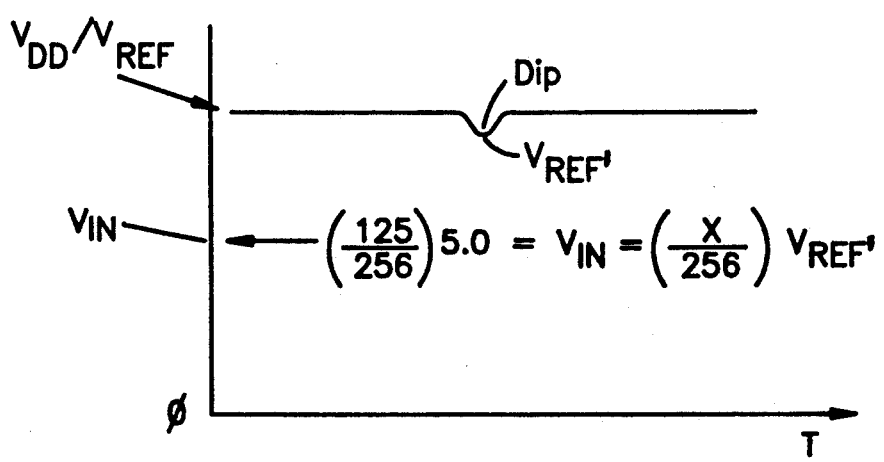
FIG. 2 is a voltage versus time plot for the device of FIG. 1 illustrating a noise perturbation affecting the conversion result.

FIG. 2 illustrates the noise problem typically encountered in the conversion process and the source of resulting error. The full-range voltage is $V_{DD}/V_{REF}$. Sampled input voltage $V_{IN}$ is compared against $V_{REF}$. The range is divided into many segments; for example, if an eight bit converter is being used, the range is divided into 256 segments. If $V_{IN}$ ideally were precisely 125 relative to 256 states, i.e., 125/256, meaning that it is at the 125th state or between the 125th and 126th states when sampling is performed, that result would be adversely affected if, during the conversion, experienced a dip. This could occur with perturbation of the power bus attributable to circuits suddenly becoming active and drawing power when clockings occur.

When the reference voltage drops (or rises, as a consequence of such disturbances), $V_{IN}$ cannot be 125/256 based on 5 volts, but instead becomes X/256 based on the new value of $V_{REF}$ (shown as $V_{REF}'$) Despite the change in reference voltage, the circuit will seek to maintain $V_{IN}$ because that value has been captured internally by the sampling. Rather, the device is now working against the new and different reference level, resulting in an error because the ratio must change to accommodate the sample voltage.

The ADC module has multiple analog input channels, four in an exemplary embodiment, multiplexed into a single sample and hold circuit and ADC. Reference voltage $V_{REF}$ may be derived internally from $V_{DD}$ or obtained externally from a pin of the device. The ADC may be of the conventional successive approximation (also known as binary search) type, except as will be described with regard to the capability to turn itself off and on, and in this example produces an 8 bit result.

A conversion is initiated by setting a control bit. Prior to conversion the appropriate channel must be selected and sufficient time allowed for the sampling to be completed. The actual conversion time is a function of the oscillator cycle, which for example may be 20 microseconds ($\mu s$). At the end of conversion, the control bit is cleared and an interrupt is activated. The overall accuracy of the conversion (zero error, full scale error, integral error and quantization error) is less than $\pm 1$ LSB for $V_{DD} = 5V \pm 10\%$ and $V_{REF} = V_{DD}$. $V_{DD}$ is typically set at 5.12V for convenient division. The resolution and accuracy is less when $V_{REF}$ is less than $V_{DD}$ or for $V_{DD}$ less than 5.12V.

Figure 3:
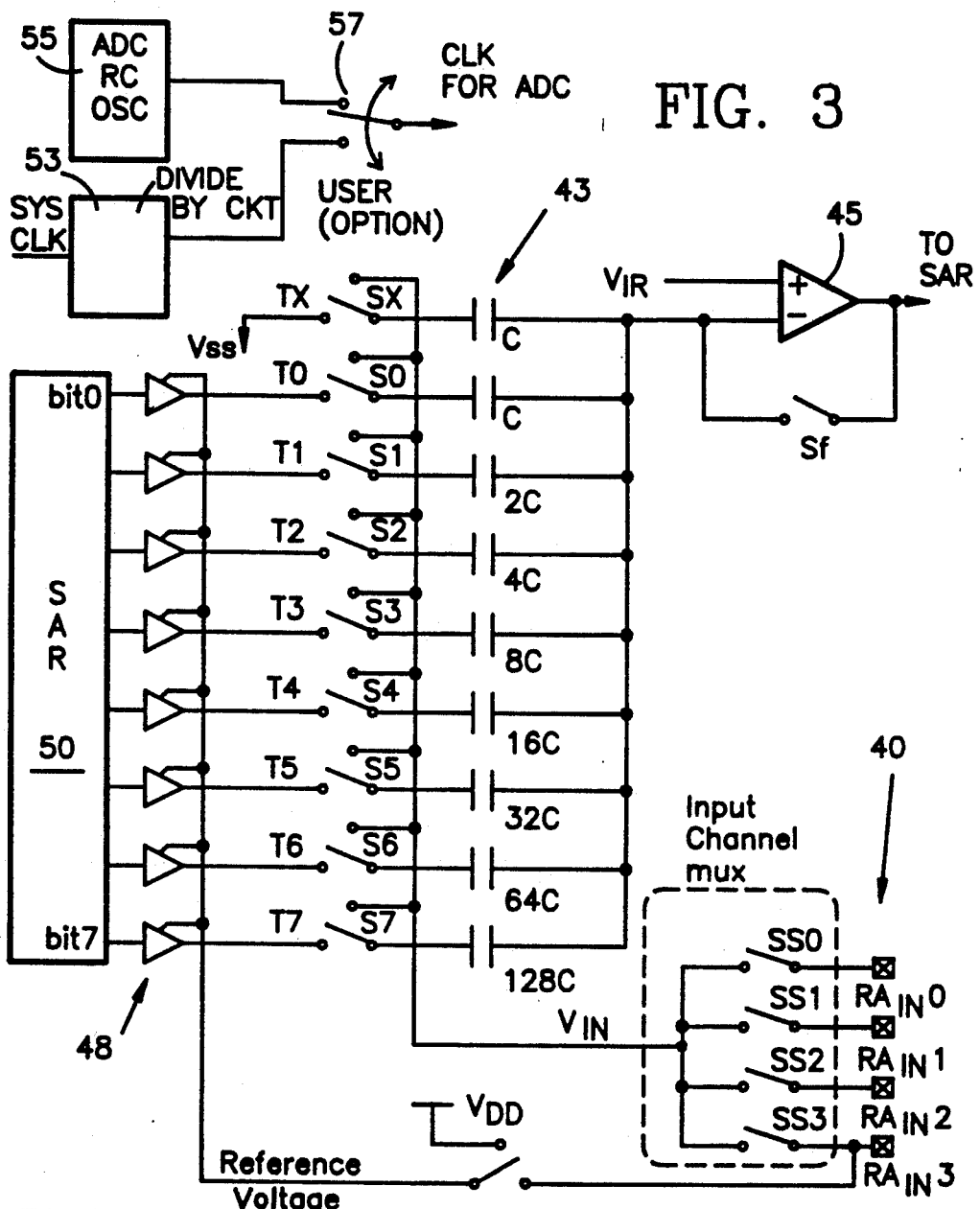
FIG. 3 is a circuit diagram of a successive approximation ADC.

Referring to FIG. 3, a successive approximation type ADC operates by sampling the selected channel through one of a plurality of sampling gates SS0-SS3. Sampling continues as long as the control bit is "0". The sampling time required depends on the source impedance of the particular analog input 40. During sampling, switch Sf is closed and switches Sx and S0-S7 connect all of the capacitors 43 to the analog input. The total effective capacitance is 256C, where C is approximately 0.2 pF in the exemplary embodiment. The voltage across the capacitors at the end of sampling is ($V_{in} - V_{IR}$) since the negative input (−ve) of the comparator 45 is maintained at $V_{IR}$ as a consequence of feedback. $V_{in}$ is the sampled voltage, and $V_{IR}$ is an internal reference voltage approximately equal to $V_{DD}/2$ ($V_{REF}/2$). The large effective capacitance acts as the holding capacitance during the conversion.

Conversion begins as soon as the control bit is set. The sampling gate (SS0–SS3) is shut off, switch Sf is opened, and the capacitors 43 maintain their charge. Conventional successive approximation steps are then carried out. Terminals T0 through T7 are driven by buffers 48 powered by $V_{REF}$ (reference voltage), and may be at either $V_{SS}$ (i.e., ground, or true zero voltage) or $V_{REF}$ potential under the control of the bits of successive approximation register (SAR) 50.

In carrying out the successive approximation process, initially terminals T0 through T6 are driven (by the buffers) to $V_{SS}$ and terminal T7 is driven to $V_{REF}$. Switch Sx is always connected to $V_{SS}$ during these steps. Physically, switches S0 through S7 are connected to respective outputs of buffers 48 while the bits in SAR 50 are set and reset to connect capacitors 43 to $V_{SS}$ or $V_{REF}$. Driving terminal T7 to $V_{REF}$ essentially subtracts one-half $V_{REF}$ from the potential at the comparator 45 input. The potential at the negative input to the comparator is ($V_{REF}/2 + V_{IR} - V_{in}$) at the first step, T7=high or "1", T6 through T0=low or "0". If the comparator output is low, indicating that $V_{in}$ is less than $0.5 V_{REF}$, the most significant bit (MSB) of SAR 50 is reset; otherwise, it is kept at "1". Next, S6 connects to $V_{REF}$ from $V_{SS}$, and so forth until all bits are resolved.

At the end of the conversion, the voltage on the inverting input of the comparator is ($V_{IR}$+residual voltage). The actual value of $V_{IR}$ is not critical except that it must be in the range of ($V_{REF}/2$)±0.3V. If $V_{IR}$ is outside this range, then during the successive approximation process the voltage at the −ve input of the comparator may go beyond $V_{DD}$ or $V_{SS}$ by 0.6V (in the exemplary embodiment), because of additional subtraction attributable to charge, which would cause parasitic diode junctions to turn on. An auxiliary comparator may be used to determine whether or not the voltage on the hold capacitor is greater or less than $V_{REF}/2$. Based on this determination, either T7 is closed before T6−T0 or vice versa, which ensures that the voltage at the −ve input to comparator 45 will not go beyond the $V_{SS}$ to $V_{DD}$ range. The offset voltage of the comparator is cancelled out during the successive approximation process. As noted above, this type of conversion process is completely conventional in and of itself, and need not be described further.

The ADC has available its own clock source, that is, independent of the microcontroller system clock. As shown in FIG. 3, the ADC has an input derived from the system clock via a divider circuit 53, and a separate RC oscillator clock 55, with selection of one or the other available via switch 57 which is at the user's option.

Figure 4:
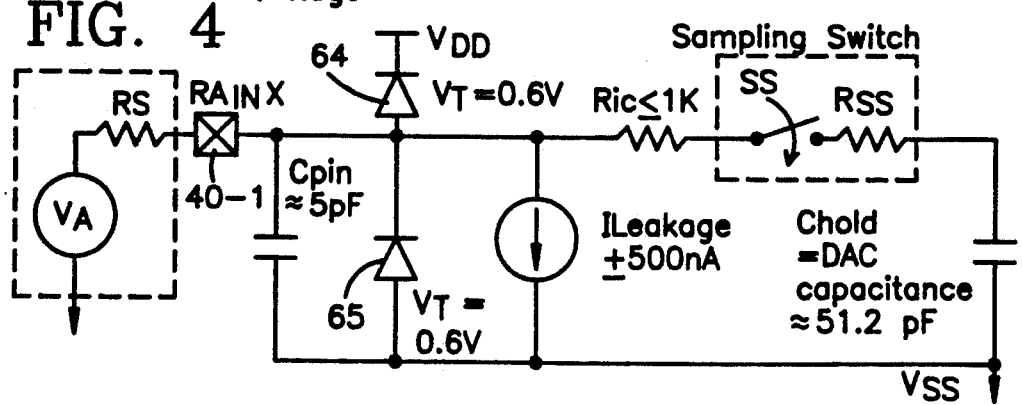
FIG. 4 is a circuit diagram of an analog input model for the successive approximation ADC of FIG. 3.

FIG. 4 illustrates a simplified circuit diagram of an analog input model for the ADC of FIG. 3. Component and parameter values shown in the Figure are by way of example for this embodiment. $C_{pin}$ is input capacitance, $V_T$ is threshold voltage, $I_{Leakage}$ is leakage current at the pin attributable to various junctions, $R_{ic}$ is interconnect resistance, SS is the sampling switch, $R_{SS}$ is on resistance of the sampling switch, $C_{hold}$ is sample/hold capacitance (from DAC), $R_S$ is the source impedance of the analog input, and $V_A$ is the analog input voltage. The sample and hold circuit consists of a sampling switch (SS) and a holding (S/H) capacitor whose value, in the exemplary embodiment, is typically 51.2 pF.

Since the analog pins (such as 40-1, the only one shown here) are connected to digital output, they would have reverse biased diodes 64 to $V_{DD}$ and 65 to $V_{SS}$. The analog input must therefore be between $V_{SS}$ and $V_{DD}$. If the input voltage deviates from this range by more than 0.6V (in the exemplary embodiment) in either direction, one of the diodes will be forward biased and a latch-up may occur.

Each step of the approximation performed by the ADC of FIG. 3 takes one A/D clock cycle (tad, which is the conversion time for each bit), derived from either an external oscillator clock input or from an on-chip RC oscillator. The conversion time for each bit is the minimum time required by the comparator to resolve one bit of the comparison, and one clock cycle should be equal to or greater than that minimum time (which in the exemplary embodiment is 2 μs, i.e., tad≧2 μs). The chip clocks and the comparator samples on the rising edge of the clock cycle, while the conversion bit result (the comparator output) is latched on the falling edge.

Figure 5:
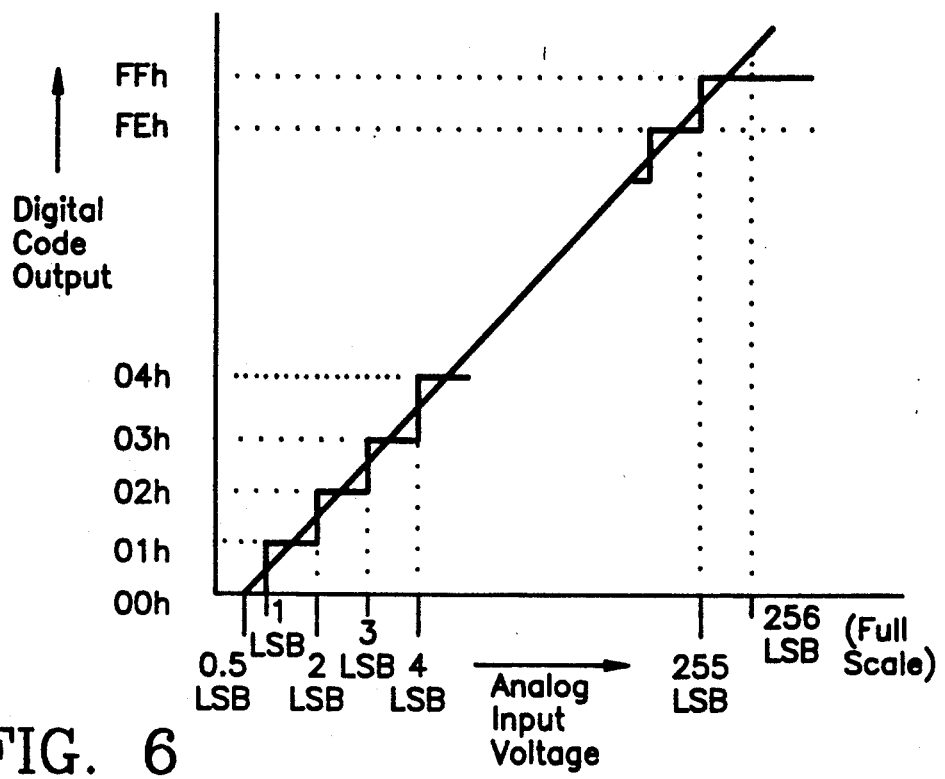
FIG. 5 is a graph of an ideal transfer function of digital output versus analog input voltage for the successive approximation converter of FIG. 3.

The ideal transfer function of the ADC is illustrated in FIG. 5, in which the first transition occurs when the analog input voltage ($V_A$) is 1 LSB (or full scale/256).

As the ADC has its own clock, from an on-chip RC oscillator, when an actual A/D conversion is commenced the microcontroller may optionally (by an instruction from the user) be placed in the low power "sleep" mode in which all of the system clocking and switching functions of the microcontroller are abated, without aborting the conversion. Although the conversion takes place with the microcontroller in "sleep" state, the sampling phase must be performed with both the microcontroller and the ADC in an active state (non-sleep). The shutdown of the microcontroller switching and consequent avoidance of its related sudden current drains and disturbances on the power supply bus during the actual conversion process eliminates the principal source of the digital switching noise that otherwise tends to reduce the accuracy of the conversion, That invention is encompassed in the aforementioned '907 application.

The control logic employed in the device allows the user to instruct the microcontroller to enter this low power sleep mode for noise-free A/D conversion. Conversion is commenced just before microcontroller sleep, to preclude the ADC from being put in sleep mode also. The control logic is further implemented to cause the ADC to notify the microcontroller (e.g., through an interrupt) when the conversion process is completed, thereby causing the microcontroller to respond (in one scenario) by restarting its clocks (oscillators) and resuming operation. Alternatively, the interrupt may be ignored.

When the microcontroller is placed in sleep, conversion will continue only if both (1) the conversion was started (actual conversion is running, not merely sampling) before sleep has executed, and (2) the conversion is being executed with the ADC using its internal RC clock. If the "sleep" instruction were given to the microcontroller while an A/D conversion is in progress using the external (to the chip) microcontroller system clock, in contrast to the ADC's own RC oscillator clock, the conversion would be aborted. In that event, all current consuming circuits are shut off, the control bit is cleared, and conversion would need to be re-initialized after wake-up, with a resampling of the analog input voltage.

According to the invention, to reduce operating current when not needed, the control logic allows the ADC to cause its biasing circuits that consume DC current, i.e., for amplifier and comparator functions, to be shut off through a control bit when not in use. These circuits must be on for sampling and conversion.

Because the ADC is capable of powering itself down (shutting itself off), and powering up (turning back on) when sampling and a conversion are to be performed— which may be once every second, once every ten milliseconds, or some other interval—the device is well adapted to battery-operated applications, where the conservation of power is a key factor in the effective lifetime of the device. An example of such an application is in the common battery-operated smoke detector. It is, of course, essential to maintain sufficient power to allow the device to perform its function. The alarm is effective only as long as the battery is not depleted, and all too often the user neglects to replace an exhausted battery or even to verify that it is in an active condition by checking that it is flashing periodically. If the device is essentially asleep—not consuming power—except when it is periodically awakened to monitor the temperature or some other sensor, and then an A/D conversion is required, which may result in generation of an alarm or a return to sleep, the useful lifetime of the device may be extended by a considerable period.

As discussed above, the ADC will ignore a sleep instruction only if the conversion is in progress and it is operating from its internal clock. After the conversion is completed, the ADC sends an interrupt to the microcontroller either to be acted on by waking the chip or to be ignored. The ADC is adapted to "wait" two tad cycles before acknowledging a "sleep" command, and, hence, the microcontroller will have had plenty of time to delay the command. If at the end of the "wait" period, the sleep line is still active, the ADC will "power-down" at that time. The same circuitry that "reads" the sleep control line also is gated with a control bit which can turn the ADC on and off.

Figure 6:
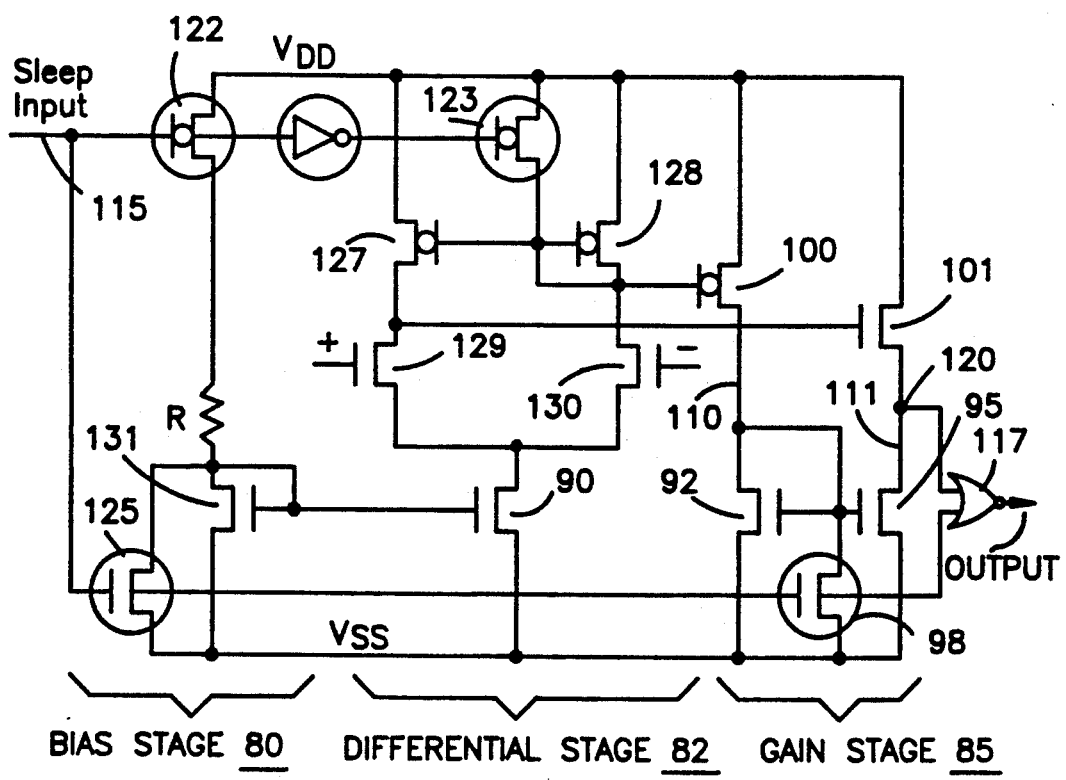
FIG. 6 is a simplified circuit diagram of a preferred embodiment of a modified amplifier of the ADC of FIG. 3 by which the ADC is adapted to power itself down according to the principles of the present invention.

A simplified circuit diagram of a modified amplifier circuit of the ADC employing the principles of the invention is shown in FIG. 6. Comparator 45 (FIG. 3) acts as such an amplifier during sampling, performing its comparator function only during actual conversions. The amplifier circuit has three separate stages, a bias circuit 80, a differential stage 82, and a gain stage 85. It is desirable to supply a voltage that will bias the transistors of the various stages into their linear mode in which they act as an ideal current source. In that mode, the transistor draws a constant current which enhances the signal amplification.

Typically, the bias circuit and other portions of the amplifier are continuously drawing power. When the bias circuit is shut off, the bias voltage on the transistor changes so that it is no longer in a linear mode. Instead, the active elements are in an off state, and various portions of the A/D converter may be shut off, including the differential stage. In the amplifier of FIG. 6, only transistor 90 is used as an ideal current source, and when it is turned off, no current will flow through the differential stage 82.

The gain stage 85 is shut off by pulling down the gates of transistors 92 and 95, employing transistor 98 for that purpose. When those devices are in an off state, no current flows through paths 110, 111 of the gain stage. The upper portion of the gain stage is further disabled by pulling p-channel transistor 100 high with a high voltage on the gate, so it does not consume any power either. In the bias stage 80 the disabling is achieved by pulling down the gate of transistor 131 with transistor 125 on. In the differential stage 82, the gates of transistors 127 and 128 are pulled up to $V_{DD}$ with transistor 123 on.

The sleep input to the amplifier is at line 115, and the sleep state of the ADC is driven or not by the signal on that line. Taking that input line high or low through control logic directly affects the states of transistors 122 and 125 and consequently of transistors 123 and 98, respectively. These, in turn, control the states of the usual transistors in the amplifier stages. The amplifier output is taken from gate 117, because if it were taken from floating node 120 the components following the output would draw current. In the transistor "off" states, for a p-channel transistor the relatively negative voltage on the gate of the transistor is less than $V_P$, where $V_P$ is the threshold of the device; and for an n-channel transistor the relatively positive voltage on the gate of the transistor is less than $V_N$, where $V_N$ is the threshold of the device.

In normal operation of the amplifier, the following conditions are present. The sleep (off) input line 115 is at $V_{SS}$ (ground). Transistor 122 is on, the voltage at the gate of transistor 123 is $V_{DD}$ and that transistor is off. Transistors 125 and 98 are also off. Transistor 131 in bias stage 80 is in the linear mode, as are transistors 127, 128, 129, 130 and 90 in differential stage 82, and transistors 92, 95, 100 and 101 in gain stage 85. In the off state of the amplifier, the conditions existing are as follows. The off input line 115 is at $V_{DD}$, the gate of transistor 123 is at $V_{SS}$ and that transistor is on. Transistor 131 in the bias stage is off, as are transistors 127, 128 and 90 in the differential stage and transistors 92, 95 and 100 in the gain stage.

Accordingly, by simply adding the components shown as circled to the overall amplifier circuit of FIG. 6, power is selectively shut off completely according to an input command, whether associated with the sleep command for the microcontroller or a separate signal, with the appropriate transistors of the various stages driven to the off-state, so that none of the stages are drawing current. In this way, the A/D converter is able to power itself down without assistance from the associated microcontroller.

Further, the power down is achieved with an extremely low current, typically about one microampere ($\mu A$), and no more than about 10 $\mu A$ for the microcontroller plus the ADC. This lower current drain is achieved primarily by process management to assure minimal leakage current during fabrication, and to identify and remove inadvertent leakage paths which arose as a result of design and fabrication of the system.

Resistor R in the amplifier circuit of FIG. 6 is implemented in the normal CMOS processing as an inactive element which when contacted at both ends, acts as a discrete resistance component. Alternatively, the resistor may be implemented as a MOSFET device.

Although a presently preferred embodiment of the invention has been illustrated and described in the foregoing specification, it will be apparent to those skilled in the relevant field that variations and modifications may readily be implemented without departing from the true spirit and scope of the invention. Accordingly, it is intended that the invention should be limited only by the appended claims and the pertinent rules of applicable law.

What is claimed is:

1. A microcontroller, microprocessor, digital signal processor or other semiconductor chip device having intelligent control logic and a system clock, and adapted to perform analog to digital conversions of a predetermined analog input signal, comprising:

means for sampling the analog input signal to generate samples thereof, analog to digital conversion means for performing conversions on the samples of the analog input signal as part of the device operation, said analog to digital conversion means including its own clock independent of said system clock, means for selectively deactivating the semiconductor chip device by generating an electrical deactivating signal to place it in a sleep mode, means responsive to a deactivating signal, for preventing deactivation of the semiconductor chip device while sampling of the analog input signal is taking place, and means for deactivating the analog to digital conversion means at selected times except when the analog to digital conversion means is performing its conversions.

2. The device of claim 1, wherein:

the analog to digital conversion means includes amplifier means with biasing circuitry, and the means for deactivating the analog to digital conversion means deactivates the biasing circuitry of the amplifier means.

3. The device of claim 1, wherein:

the means for deactivating the analog to digital conversion means turns off the power consuming elements thereof.

4. The device of claim 1, wherein:

the analog to digital conversion means comprises a CMOS integrated circuit fabricated on a single semiconductor chip as part of the device.

5. In a microcontroller for performing embedded control of a controlled system, and adapted to convert samples of an analog signal in the system representing a variable parameter indicative of whether or not a control function is to be exercised by the microcontroller to a digital form, and including a system clock and a source of power for the microcontroller, the improvement comprising:

an analog to digital converter for converting the analog samples to digital form, said converter including an internal clock independent of the microcontroller system clock, control logic means for generating a command to disable the system clock and thereby place the microcontroller in a sleep state in the absence of need for exercise of a control function by the microcontroller, without affecting conversions in progress by the converter, and including means for powering down the analog to digital converter upon completion of the conversions in progress while the system clock remains disabled.

6. The improvement of claim 5, wherein:

the converter includes means for generating an interrupt signal upon completion of the conversions in progress to restore the system clock and thereby awaken the microcontroller from the sleep state.

7. The improvement of claim 6, wherein:

the converter further includes means for sensing whether the microcontroller has ignored the interrupt signal and, if so, for powering itself down.

8. The improvement of claim 7, wherein:

the converter further includes means for detecting awakening of the microcontroller to turn itself back on for further sampling and conversions.

9. The improvement of claim 8, wherein:

the control logic means includes means responsive to ongoing sampling of the analog signal for causing the microcontroller to ignore the command to disable the system clock, and thereby prevent the microcontroller from entering the sleep state.

10. A method of operating a microcontroller device adapted to perform analog to digital conversions of samples of an analog signal derived from a controllable electronic system to determine whether a predetermined control function of the microcontroller device should be performed, said microcontroller device having an analog to digital converter, intelligent control logic and a device clock for timing functions within the microcontroller device operation, said method comprising the steps of:

converting a plurality of samples obtained from the analog signal to digital format using the analog to digital converter in conjunction with an internal clock separate from and independent of the device clock, instructing the microcontroller device from the control logic to enter a sleep state in which all timing and switching functions controlled by the device clock are ceased, continuing the conversions of the obtained samples using the internal clock after the microcontroller device has been put in a sleep state, and ignoring the instruction to the microcontroller device to enter the sleep state until after all of the samples of the analog signal have been obtained.

11. The method of claim 10, including:

commencing the conversions by the analog to digital converter as a signal to the control logic for instructing the microcontroller device to enter the sleep state, while preventing the analog to digital converter from being put in sleep state simultaneously with the microcontroller device.

12. The method of claim 11, further including:

notifying the microcontroller device by generating an interrupt signal when the conversions of all samples are completed by the analog to digital converter, to enable the microcontroller device to restart the device clock.

13. The method of claim 12, further including:

monitoring the microcontroller device to determine whether it has restarted the device clock after generating the interrupt signal, and, if it has not, notifying the analog to digital converter to enter a sleep state.

14. The method of claim 12, further including:

upon notifying the analog to digital converter to enter a sleep state, deactivating all of its direct current consuming circuitry.

* * * * *